US012733272B2

(12) United States Patent
Ma et al.

(10) Patent No.: US 12,733,272 B2
(45) Date of Patent: Sep. 8, 2026

(54) MULTISPECTRAL SENSOR AND ELECTRONIC DEVICE

(71) Applicant: HONOR DEVICE CO., LTD., Shenzhen (CN)

(72) Inventors: Kun Ma, Shenzhen (CN); Bin Yan, Shenzhen (CN)

(73) Assignee: Honor Device Co., Ltd., Shenzhen (CN)

( * ) Notice: Subject to any disclaimer, the term of this patent is extended or adjusted under 35 U.S.C. 154(b) by 78 days.

(21) Appl. No.: 18/564,903

(22) PCT Filed: Aug. 12, 2022

(86) PCT No.: PCT/CN2022/111960
§ 371 (c)(1),
(2) Date: Nov. 28, 2023

(87) PCT Pub. No.: WO2023/115990
PCT Pub. Date: Jun. 29, 2023

(65) Prior Publication Data

US 2024/0387569 A1 Nov. 21, 2024

(30) Foreign Application Priority Data

Dec. 22, 2021 (CN) ......................... 202111584863.4

(51) Int. Cl.
*H10F 39/00* (2025.01)
*H04M 1/02* (2006.01)
(Continued)

(52) U.S. Cl.
CPC ......... *H10F 39/8023* (2025.01); *H04N 23/11* (2023.01)

(58) Field of Classification Search
CPC ............ G01J 2003/2806; G02B 5/201; H10F 39/806; H10F 39/182; H10F 39/12;
(Continued)

(56) References Cited

U.S. PATENT DOCUMENTS 7,123,298 B2 10/2006 Schroeder et al.
8,208,054 B2 6/2012 Yamaguchi
(Continued)

FOREIGN PATENT DOCUMENTS

CN 1922864 A 2/2007
CN 105806796 A 7/2016
(Continued)

*Primary Examiner* — Sonya McCall-Shepard
(74) *Attorney, Agent, or Firm* — Fish & Richardson P.C.

(57) ABSTRACT

Embodiments of this application provide a multispectral sensor and an electronic device. The multispectral sensor includes a light channel. The light channel includes a light entrance part, an optical lens, a filter part, and a sensor array. Orthographic projection of the sensor array is located in orthographic projection of the optical lens in an axial direction of the light entrance part. The sensor array includes at least three rows of photoelectric sensors. The at least three rows of photoelectric sensors are divided into a middle sensor group and an edge sensor group. The middle sensor group includes a first photoelectric sensor. The edge sensor group includes a second photoelectric sensor. In a row direction of the sensor array, a row of first photoelectric sensors includes N first photoelectric sensors and N−1 first gaps. The first gap is formed between two adjacent first photoelectric sensors.

20 Claims, 12 Drawing Sheets

(51) Int. Cl.

| | |
|---|---|
| ***H04N 23/10*** | (2023.01) |
| ***H04N 23/11*** | (2023.01) |
| ***H04N 23/13*** | (2023.01) |
| ***H04N 23/81*** | (2023.01) |
| ***H04N 25/10*** | (2023.01) |
| ***H04N 25/61*** | (2023.01) |
| ***H04N 25/701*** | (2023.01) |
| ***H04N 25/702*** | (2023.01) |
| ***H04N 25/79*** | (2023.01) |
| ***H10F 39/12*** | (2025.01) |
| ***H10F 39/18*** | (2025.01) |

(58) Field of Classification Search

CPC .. H10F 39/18; H10F 39/8053; H10F 39/8023; H10F 39/802; H10F 39/8027; H04N 23/11; H04N 23/81; H04N 23/10; H04N 23/13; H04N 25/61; H04N 25/702; H04N 25/79; H04N 25/10; H04N 25/7013; H04M 1/0264

See application file for complete search history.

(56) References Cited

U.S. PATENT DOCUMENTS

| | | | | |
|---|---|---|---|---|
| 10,739,189 | B2 | 8/2020 | Pacala et al. | |
| 11,209,311 | B2 | 12/2021 | Klimek | |
| 11,293,806 | B2 | 4/2022 | Berlatzky | |
| 11,303,827 | B2 | 4/2022 | Siddique et al. | |
| 2005/0078377 | A1 | 4/2005 | Li et al. | |
| 2005/0134698 | A1 | 6/2005 | Schroeder et al. | |
| 2006/0023314 | A1 | 2/2006 | Boettiger et al. | |
| 2008/0259194 | A1 | 10/2008 | Silverstein | |
| 2010/0295143 | A1 | 11/2010 | Yokogawa | |
| 2012/0188422 | A1 | 7/2012 | Cho | |
| 2015/0123233 | A1 | 5/2015 | Yaung et al. | |
| 2015/0303228 | A1 | 10/2015 | Rohr et al. | |
| 2017/0324901 | A1 | 11/2017 | Mandelli | |
| 2018/0324286 | A1 | 11/2018 | Cheng | |
| 2019/0356765 | A1 | 11/2019 | Cheng | |
| 2020/0116558 | A1* | 4/2020 | Pacala | H10F 39/8053 |
| 2021/0066356 | A1 | 3/2021 | Sugizaki | |
| 2023/0402473 | A1 | 12/2023 | Huang et al. | |
| 2024/0015385 | A1 | 1/2024 | Huang et al. | |

FOREIGN PATENT DOCUMENTS

| | | | |
|---|---|---|---|
| CN | 108513112 | A | 9/2018 |
| CN | 110494723 | A | 11/2019 |
| CN | 210129913 | U | 3/2020 |
| CN | 111952327 | A | 11/2020 |
| CN | 112449096 | A | 3/2021 |
| CN | 112805584 | A | 5/2021 |
| CN | 113418864 | A | 9/2021 |
| CN | 113495312 | A | 10/2021 |
| CN | 113540138 | A | 10/2021 |
| DE | 102019113597 | B3 | 8/2020 |
| EP | 3913405 | A2 | 11/2021 |
| JP | 2010147785 | A | 7/2010 |
| KR | 20210102026 | A | 8/2021 |
| WO | 2008133146 | A1 | 11/2008 |

* cited by examiner

MULTISPECTRAL SENSOR AND ELECTRONIC DEVICE

CROSS-REFERENCE TO RELATED APPLICATIONS

This application is a national stage of International Application No. PCT/CN2022/111960, filed Aug. 12, 2022, which claims priority to Chinese Patent Application No. 202111584863.4, filed on Dec. 22, 2021. The disclosures of the aforementioned applications are hereby incorporated by reference in their entireties.

TECHNICAL FIELD

Embodiments of this application relate to the field of terminal technologies, and in particular, to a multispectral sensor and an electronic device.

BACKGROUND

There is a difference between a multispectral imaging technology and full spectrum imaging or white light imaging. The multispectral imaging technology refers to separating different spectra for a plurality of times of imaging. A same object is collected and a multispectral image is obtained through an inconsistent degree of absorption and reflection of objects under different spectra. Then, detail enhancement may be performed on the multispectral image and processing may be performed on an algorithm of feature extraction, to find different details. The multispectral imaging technology is a photoelectric imaging technology and an application in machine vision.

With the explosive growth of electronic devices such as a smartphone or a tablet computer, the electronic device has more functions. As an imaging technology of the electronic device continues to develop, people have increasingly higher requirements for accuracy of color reproduction when taking photos under various conditions. Especially under different ambient lighting sources, it is easy to cause color distortion and affect image quality. When an electronic device equipped with a multispectral sensor is in a photo-taking mode, the multispectral sensor may provide spectral measurement, thereby improving the accuracy of color reproduction. However, the multispectral sensor in the electronic device has low signal-to-noise ratio and sensitivity, which affects spectral detection performance of the multispectral sensor.

SUMMARY

Embodiments of this application provide a multispectral sensor and an electronic device, to improve a low signal-to-noise ratio and sensitivity of the multispectral sensor.

A first aspect of this application provides a multispectral sensor, and the multispectral sensor includes at least one or two or more light channels. The light channel includes a light entrance part, an optical lens, a filter part, and a sensor array. The light entrance part is configured to allow external light to enter the light channel. The optical lens is configured to change a transmission path of light to be incident on the filter part. The filter part is configured to allow light in a specific wavelength range to pass through and reach the sensor array. Orthographic projection of the sensor array is located in orthographic projection of the optical lens in an axial direction of the light entrance part. The sensor array includes at least three rows of photoelectric sensors. The at least three rows of photoelectric sensors are divided into a middle sensor group and an edge sensor group. The middle sensor group is located between the two edge sensor groups in a column direction of the sensor array. The middle sensor group includes a first photoelectric sensor. The edge sensor group includes a second photoelectric sensor. In a row direction of the sensor array, a row of first photoelectric sensors includes N first photoelectric sensors and N−1 first gaps. The first gap is formed between two adjacent first photoelectric sensors. A quantity of second photoelectric sensors in a row adjacent to the row of first photoelectric sensors is N−1. The second photoelectric sensor is arranged corresponding to the first gap in the column direction.

In the multispectral sensor in embodiments of this application, the sensor array includes a middle sensor group and an edge sensor group. The edge sensor group is arranged on one side of the middle sensor group. The first photoelectric sensor and the second photoelectric sensor in the sensor array are arranged in a mutually misaligned manner. The first photoelectric sensor and the second photoelectric sensor are located in different regions. A quantity of second photoelectric sensors in a row is less than a quantity of first photoelectric sensors in each row in the middle sensor group, so that one complete second photoelectric sensor is not separately arranged in a corner region of the sensor array, which in turn may cause the sensor array to better retain a field of view and a quantity of regions in which the sensor array receives light, and discard the independently arranged photoelectric sensor in the corner region with poor detection performance. Therefore, the multispectral sensor in embodiments of this application is conducive to improving a case that a signal-to-noise ratio and sensitivity of the photoelectric sensor are reduced due to low illuminance of the light received by the photoelectric sensor arranged separately in the corner region, which is conducive to ensuring that the multispectral sensor has good detection sensitivity and high light energy utilization, and implements spectral detection with better comprehensive effects.

In a possible implementation, the first photoelectric sensor has a first center. The middle sensor group includes two or more rows of first photoelectric sensors. The first centers of each column of first photoelectric sensors are located on a same straight line, so that in a column direction, each first photoelectric sensor is arranged regularly.

In a possible implementation, a shape and a size of the first photoelectric sensor are respectively the same as a shape and a size of the second photoelectric sensor, so that a photosensitive area of the first photoelectric sensor and a photosensitive area of the second photoelectric sensor are the same, and an angle range in which the first photoelectric sensor receives light and an angle range in which the second photoelectric sensor receives light are the same, which is conducive to improving accuracy of regional detection of a target scene by the sensor array.

In a possible implementation, the second photoelectric sensor has a second center. Lines connecting one second center and two adjacent first centers form an equilateral triangle. Therefore, in the edge sensor group, the second photoelectric sensor is not separately arranged in a partial region corresponding to the first photoelectric sensor at the outermost side, so that the sensor array does not receive light in the region, which is conducive to reducing possibility that the signal-to-noise ratio and the sensitivity are decreased due to the low illuminance received by the second photoelectric sensor arranged separately in the region, affecting spectral detection performance.

In a possible implementation, a quantity of second photoelectric sensors in a row is three or more. A photosensitive area of at least one of the two second photoelectric sensors located at the outermost side is greater than a photosensitive area of the first photoelectric sensor in the row direction. Therefore, at least one of the two second photoelectric sensors located at the outermost side may compensate for the low illuminance in the corner region by increasing the photosensitive area, so that the sensor array may retain the field of view and the quantity of regions that receive light to a greater extent without the need to separately arrange one second photoelectric sensor in the corner region, which is conducive to ensuring that the multispectral sensor has good detection sensitivity and high light energy utilization, and implements spectral detection with better comprehensive effects.

In a possible implementation, a photosensitive area of at least one of the two second photoelectric sensors located at the outermost side is greater than a photosensitive area of the second photoelectric sensor located in a middle region in the row direction.

In a possible implementation, a shape and a size of the second photoelectric sensor located in the middle region are respectively the same as a shape and a size of the first photoelectric sensor in the row direction.

In a possible implementation, there is a second gap between two adjacent second photoelectric sensors in the row direction, thereby helping to reduce possibility of light crosstalk between the two adjacent second photoelectric sensors and ensuring that the sensor array has good detection accuracy.

In a possible implementation, the first gap and the second gap are not on a same straight line in the column direction.

In a possible implementation, there is a third gap between the first photoelectric sensor and the second photoelectric sensor in the column direction, thereby helping to reduce possibility of light crosstalk between the first photoelectric sensor and the second photoelectric sensor and ensuring that the sensor array has good detection accuracy.

In a possible implementation, the middle sensor group includes two or more rows of first photoelectric sensors. There is a fourth gap between two adjacent first photoelectric sensors in the column direction, thereby helping to reduce possibility of light crosstalk between the first photoelectric sensor and the second photoelectric sensor and ensuring that the sensor array has good detection accuracy.

In a possible implementation, the first photoelectric sensor has a first center. The first centers in each row of first photoelectric sensors are located on a same straight line in the row direction, so that each first photoelectric sensor is arranged in a regular and orderly manner in the row direction.

In a possible implementation, the second photoelectric sensor has a second center. The second centers in each row of second photoelectric sensors are located on a same straight line in the row direction, so that each second photoelectric sensor is arranged in a regular and orderly manner.

In a possible implementation, in the middle sensor group, each first photoelectric sensor is in a shape of a rectangle.

In a possible implementation, the multispectral sensor includes two or more rows of light channels. Each light channel has a channel center. There is a fifth gap between two adjacent light channels in each row of light channels. In the two adjacent rows of light channels, one row of light channels are arranged corresponding to the fifth gap in the other row of light channels, and lines connecting the channel centers of the two adjacent light channels in the one row and the channel center of a corresponding light channel in the other row form a triangle. Therefore, in the column direction, a length of a perpendicular line between channel centers of the two adjacent light channels in one row and the channel center of one light channel in the other row is less than a length of lines connecting any two of the three channel centers. Therefore, a distance between the two adjacent rows of light channels is less in the column direction, so that in a case of ensuring that the multispectral sensor has high detection performance, an overall area occupied by the sensor array is reduced, thereby improving space utilization, and being conducive to miniaturization design of the multispectral sensor. In this way, the multispectral sensor may be integrated into an electronic device with an overall compact structure.

In a possible implementation, the lines connecting the channel centers of the two adjacent light channels in the one row and the channel center of the corresponding light channel in the other row form an equilateral triangle, so that a distance between any two of the three channel centers is equal. Therefore, the distance between the three light channels is equal, which is conducive to reducing possibility that the two adjacent light channels are prone to crosstalk due to the less distance between the two adjacent light channels in the three light channels, thereby ensuring detection accuracy and detection performance of the multispectral sensor.

In a possible implementation, in each row of light channels, the channel centers of the light channels are located on a same straight line in the row direction, so that each light channel is arranged in a regular and orderly manner, which is conducive to ensuring that an overall size of the multispectral sensor is regular.

In a possible implementation, an orthographic projection area of each optical lens is the same. A shape and a size of each light entrance part are the same, which is conducive to ensuring consistency of a field of view of each light channel and ensures the detection accuracy of the multispectral sensor.

In a possible implementation, at least one of the two or more rows of light channels is a color channel of visible light, so that visible light may be received for detection.

According to a second aspect of this application, an electronic device is provided, and the electronic device includes at least one multispectral sensor. The multispectral sensor includes at least one or two or more light channels. Each light channel includes a light entrance part, an optical lens, a filter part, and a sensor array. The light entrance part is configured to allow external light to enter the light channel. The optical lens is configured to change a transmission path of light to be incident on the filter part. The filter part is configured to allow light in a specific wavelength range to pass through and reach the sensor array. Orthographic projection of the sensor array is located in orthographic projection of the optical lens in an axial direction of the light entrance part. The sensor array includes at least three rows of photoelectric sensors. The at least three rows of photoelectric sensors are divided into a middle sensor group and an edge sensor group. The middle sensor group is located between the two edge sensor groups in a column direction of the sensor array. The middle sensor group includes a first photoelectric sensor. The edge sensor group includes a second photoelectric sensor. In a row direction of the sensor array, a row of first photoelectric sensors includes N first photoelectric sensors and N−1 first gaps. The first gap is formed between two adjacent first photoelectric sensors. A quantity of second photoelectric sensors in a row adjacent to the row of first photoelectric sensors is N−1. The second photoelectric sensor is arranged corresponding to the first gap in the column direction.

REFERENCE NUMERALS

10. Electronic device;
20. display assembly;
30. housing;
40. main board;
50. electronic component;
60. camera module;
70. spectral sensor; 701. first gap; 701*a*. center line; 702. second gap; 703. third gap; 704. fourth gap; 705. fifth gap; 71. light channel; 71*a*. optical axis; 71*b*. channel center; 72. light entrance part; 73. substrate; 74. optical lens; 75. filter part; 76. sensor array; 76*a*. corner region; 76*b*. middle sensor group; 76*c*. edge sensor group; 760. photoelectric sensor; 761. first photoelectric sensor; 761*a*. first center;
762. second photoelectric sensor; 762*a*. second center; 7621. rectangular region; 7622. fan-shaped region; 77. shell;
X. row direction; Y. column direction; and Z. axial direction.

DESCRIPTION OF EMBODIMENTS

An electronic device in embodiments of this application may be referred to as user equipment (user equipment, UE), a terminal (terminal), or the like. For example, the electronic device may be a mobile terminal or a fixed terminal, such as a portable android device (portable android device, PAD), a personal digital assistant (personal digital assistant, PDA), a handheld device with a wireless communication function, a computing device, a vehicle-mounted device, a wearable device, a virtual reality (virtual reality, VR) terminal device, an augmented reality (augmented reality, AR) terminal device, a wireless terminal in industrial control (industrial control), a wireless terminal in self-driving (self-driving), a wireless terminal in remote medical (remote medical), a wireless terminal in a smart grid (smart grid), a wireless terminal in transportation safety (transportation safety), a wireless terminal in a smart city (smart city), a wireless terminal in a smart home (smart home), or the like. The forms of the terminal device are not specifically limited in embodiments of this application.

Figure 1:
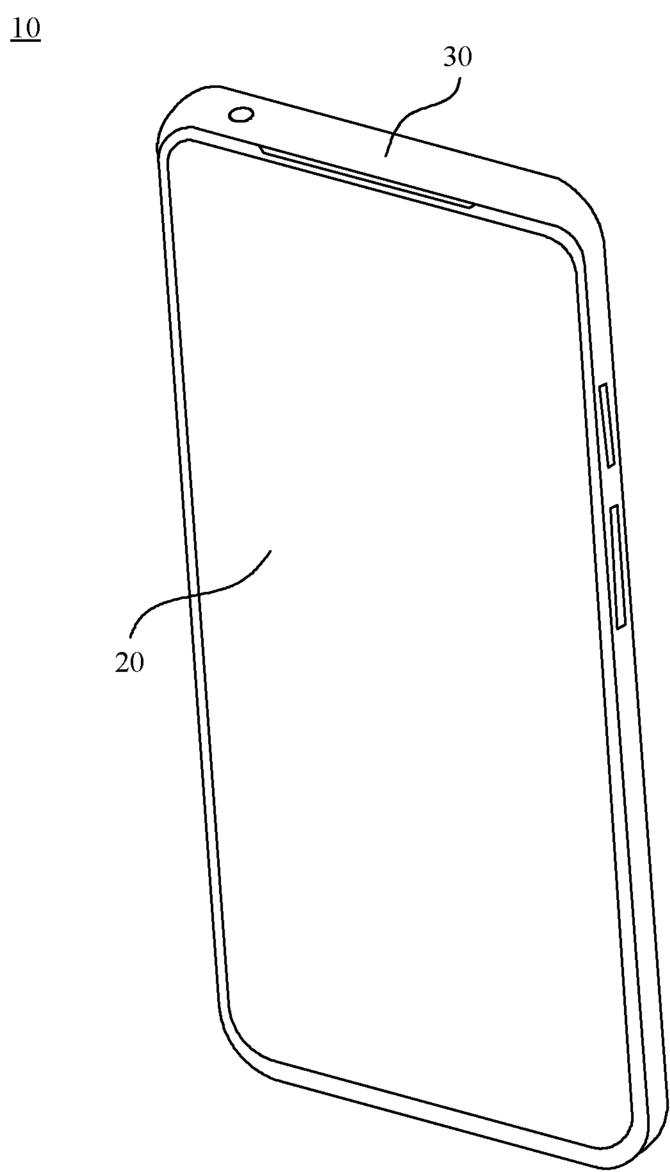
FIG. 1 is a schematic diagram of a structure of an electronic device.

In embodiments of this application, FIG. 1 schematically shows a structure of an electronic device 10 according to an embodiment. Referring to FIG. 1, an example in which the electronic device 10 is a handheld device with a wireless communication function is used for description. For example, the handheld device with the wireless communication function may be a mobile phone.

Figure 2:
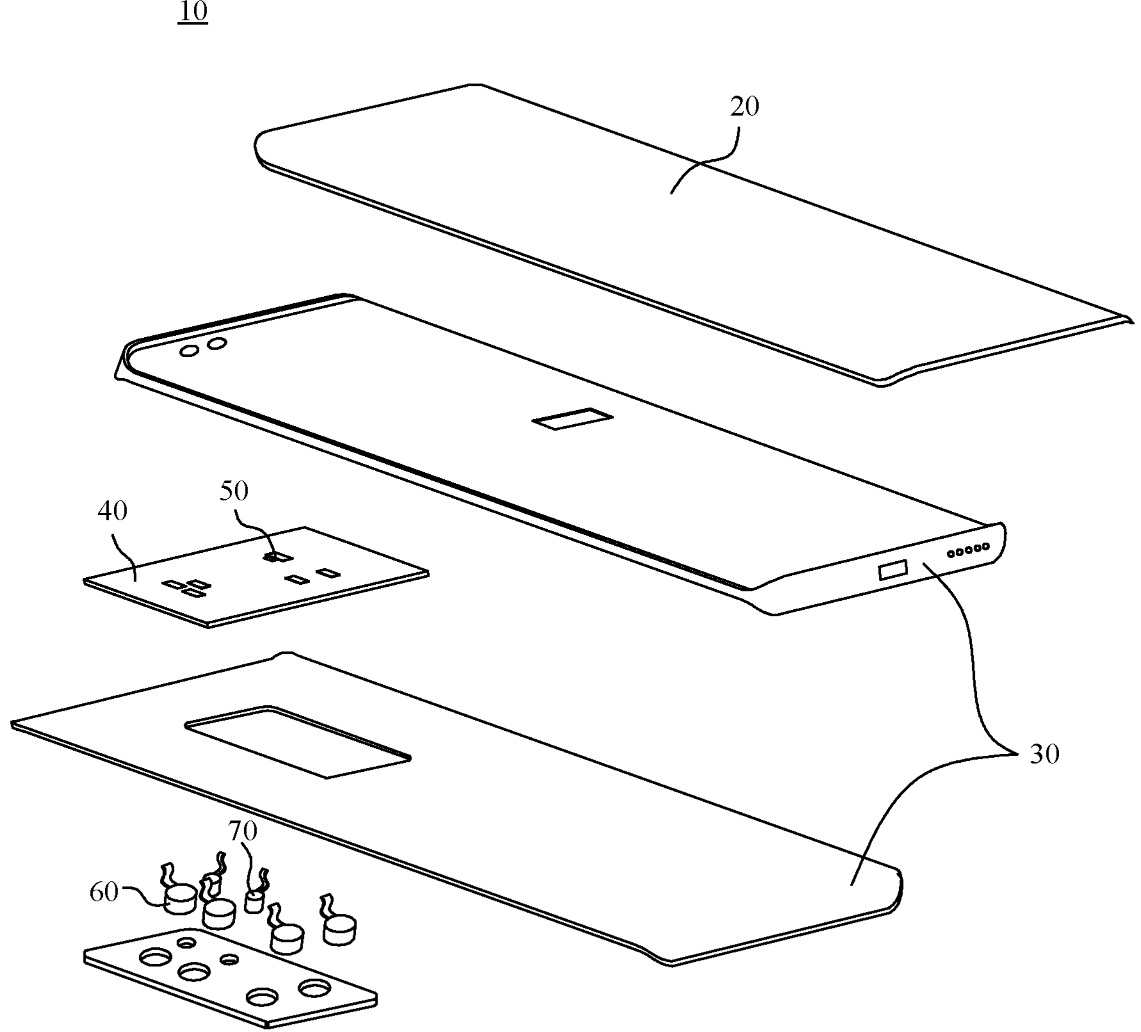
FIG. 2 is a schematic diagram of a partially exploded structure of an electronic device according to the embodiment shown in FIG. 1.

FIG. 2 schematically shows a partially exploded structure of an electronic device 10. Referring to FIG. 2, the electronic device 10 in embodiments of this application includes a display assembly 20, a housing 30, a main board 40, and an electronic component 50. The display assembly 20 has a display region used for displaying image information. The display assembly 20 is mounted on the housing 30, and a display region of the display assembly 20 is exposed to facilitate presenting image information to a user. The main board 40 is connected to the housing 30 and is located on an inner side the display assembly 20, so that the main board 40 is not easily visible to the user outside the electronic device 10. The electronic component 50 is arranged on the main board 40. The main board 40 may be a printed circuit board (printed circuit board, PCB). For example, the electronic component 50 is soldered to the main board 40 through a soldering process. The electronic component 50 includes but is not limited to a central processing unit (central processing unit, CPU), an intelligent algorithm chip, or a power management chip (Power Management IC, PMIC).

Figure 3:
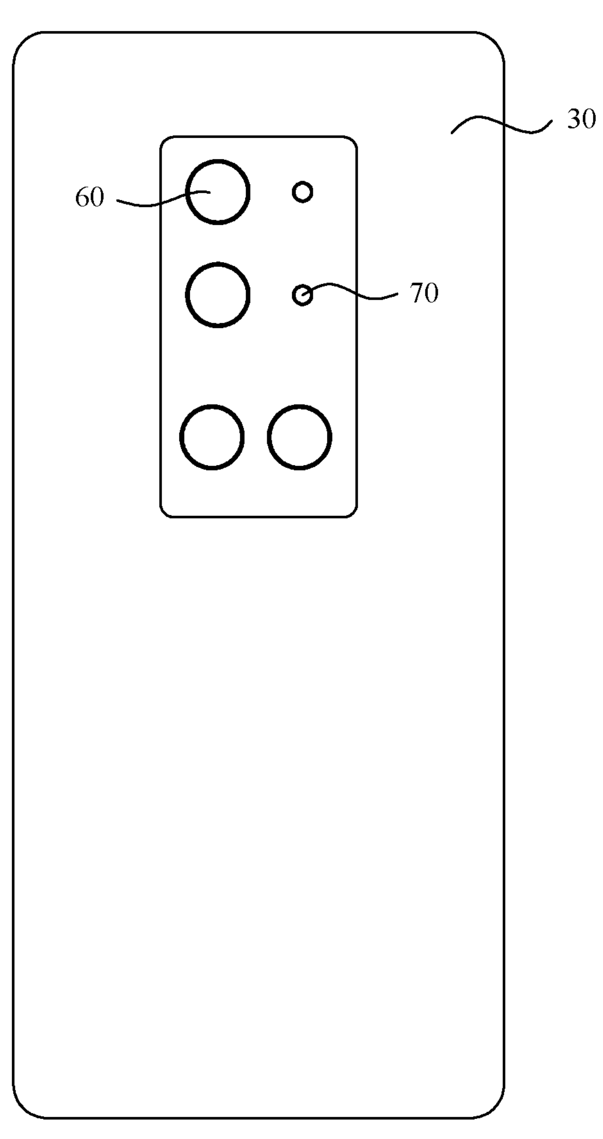
FIG. 3 is a schematic diagram of a structure of a back surface of an electronic device according to the embodiment shown in FIG. 1.

FIG. 3 schematically shows a structure of a back surface of an electronic device 10. Referring to FIG. 2 and FIG. 3, the electronic device 10 further includes a camera module 60 and a multispectral sensor 70. Both the camera module 60 and the multispectral sensor 70 are electrically connected to a main board 40. In the electronic device 10, the multispectral sensor 70 and the camera module 60 are arranged on a housing 30 in a mutually misaligned manner. The camera module 60 is configured to take photos and images of a target scene. The camera module 60 may include a plurality of lenses, for example, include but not is limited to, a wide-angle lens or a periscope telephoto lens. When taking photos of a target by using the electronic device 10, the multispectral sensor 70 may collect ambient light and process and analyze the ambient light to obtain a multispectral image or a reconstructed multispectral image. The obtained multispectral image by collecting or the reconstructed multispectral image may be configured to perform qualitative analysis on composition of a to-be-photographed object. For example, a more accurate environmental color temperature may be obtained through the multispectral sensor 70, and a color of the to-be-photographed object may be restored based on the environmental color temperature, which may reduce possibility of color distortion that affects image quality under different environments and mixed lighting sources. Alternatively, material composition identification may be performed through the multispectral sensor 70. Alternatively, the multispectral sensor 70 may detect a frequency of the light source and adjust exposure time based on frequency information of the light source, thereby more accurately eliminating a stroboscopic phenomenon in the image. Therefore, multispectral image data collected based on the multispectral sensor 70 may be applied in a plurality of different usage scenarios.

Figure 4:
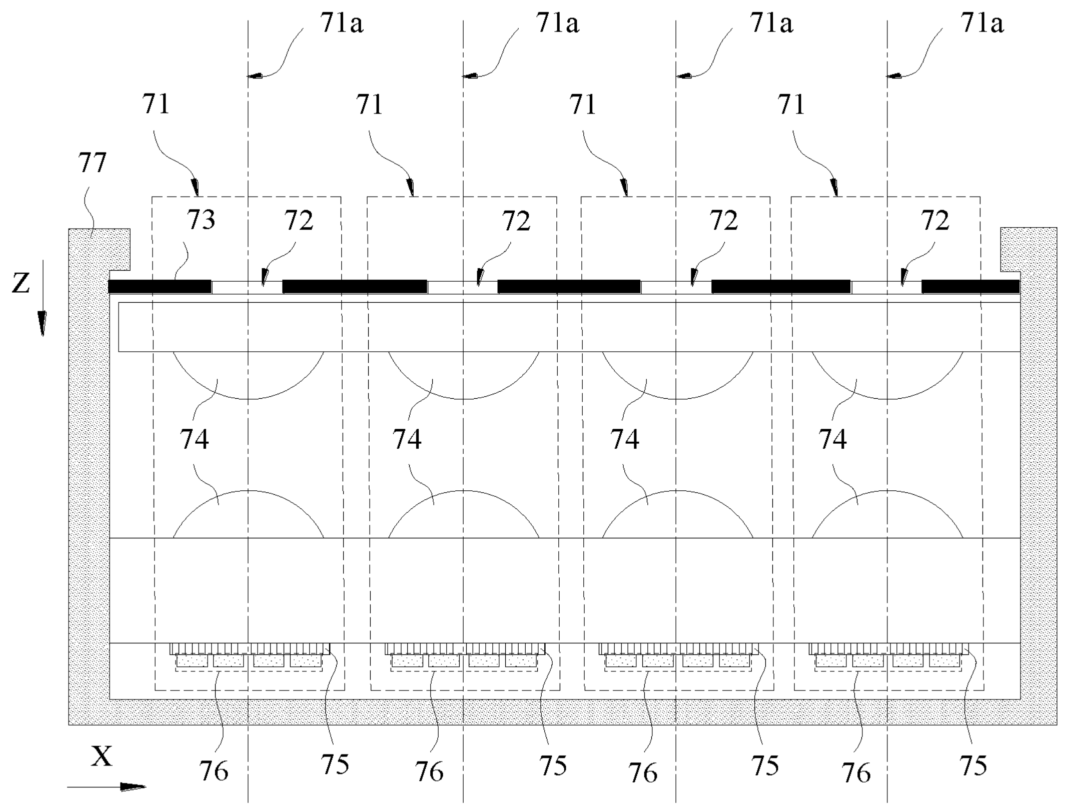
FIG. 4 is a schematic diagram of a partial cross-sectional structure of a multispectral sensor in an electronic device according to the embodiment shown in FIG. 1.
Figure 5:
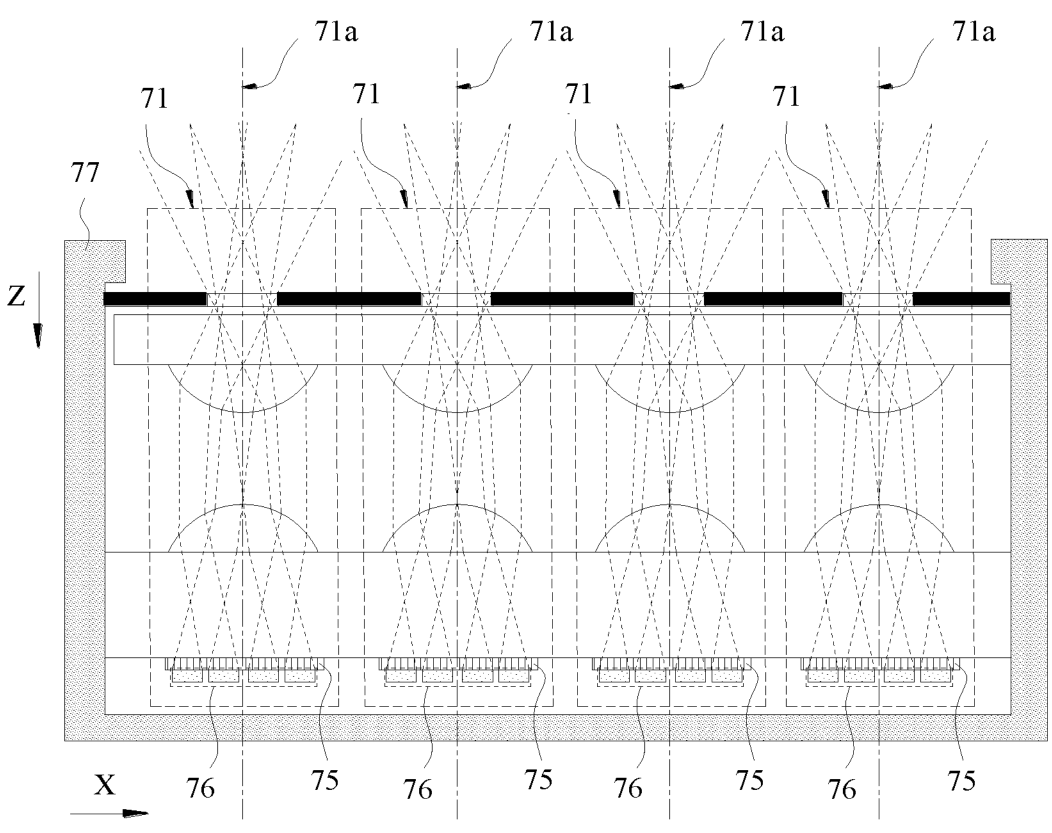
FIG. 5 is a schematic diagram of a state of a multispectral sensor receiving light according to the embodiment shown in FIG. 4.

FIG. 4 schematically shows a partial cross-sectional structure of a multispectral sensor 70. FIG. 5 schematically shows a state in which a multispectral sensor 70 receives light. Referring to FIG. 4 and FIG. 5, the multispectral sensor 70 includes a light channel 71 having an optical axis 71*a*. It should be noted that an angle between light incident on the light channel 71 along the optical axis 71*a* and the optical axis 71*a* is 0°. The light channel 71 includes a light entrance part 72, an optical lens 74, a filter part 75, and a sensor array 76. A shape and a size of the light entrance part 72 are configured to define a field of view when the light entrance part 72 is at a focal plane of the optical lens 74. The sensor array 76 includes a plurality of photoelectric sensors 760. Each photoelectric sensor 760 may receive light from a part of regions in a target scene. External light may enter the multispectral sensor 70 through the light entrance part 72, then change a transmission path through the optical lens 74, and then illuminate the filter part 75. Then, light at different angles to the optical axis 71*a* passes through the filter part 75 and then respectively reaches different photoelectric sensors 760 in the sensor array 76. It should be noted that the external light may be light directly from a light source (for example, the sun, a lighting device, or the like) in an external environment and light (for example, light reflected from a tree, a wall, a road, a to-be-photographed object, or the like) reflected or scattered by an object in the external environment.

Figure 6:
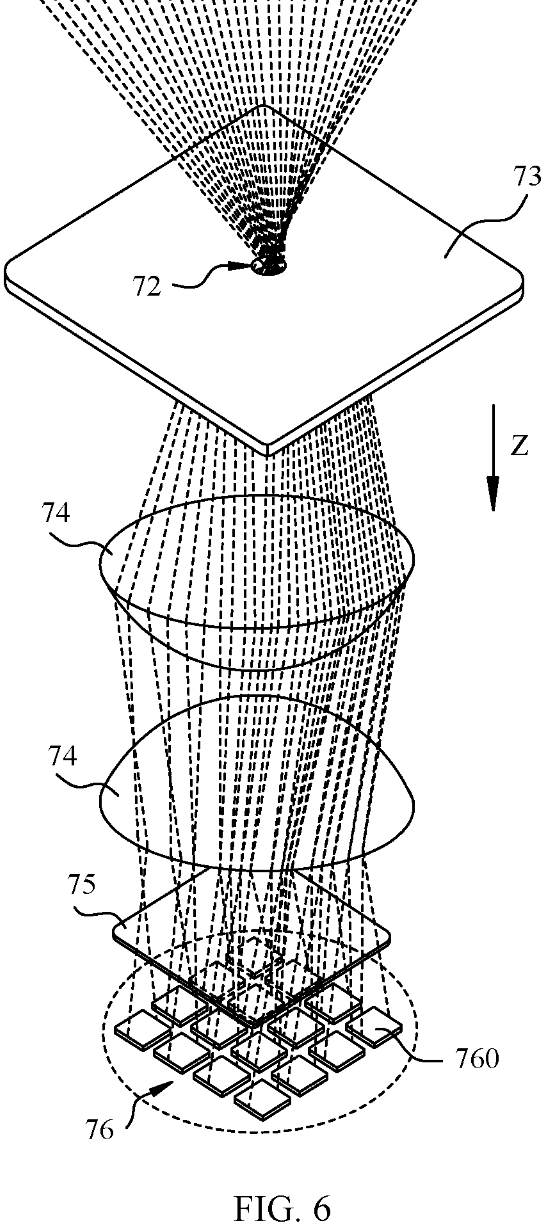
FIG. 6 is a schematic diagram of a state of a light channel receiving light in a multispectral sensor.
Figure 7:
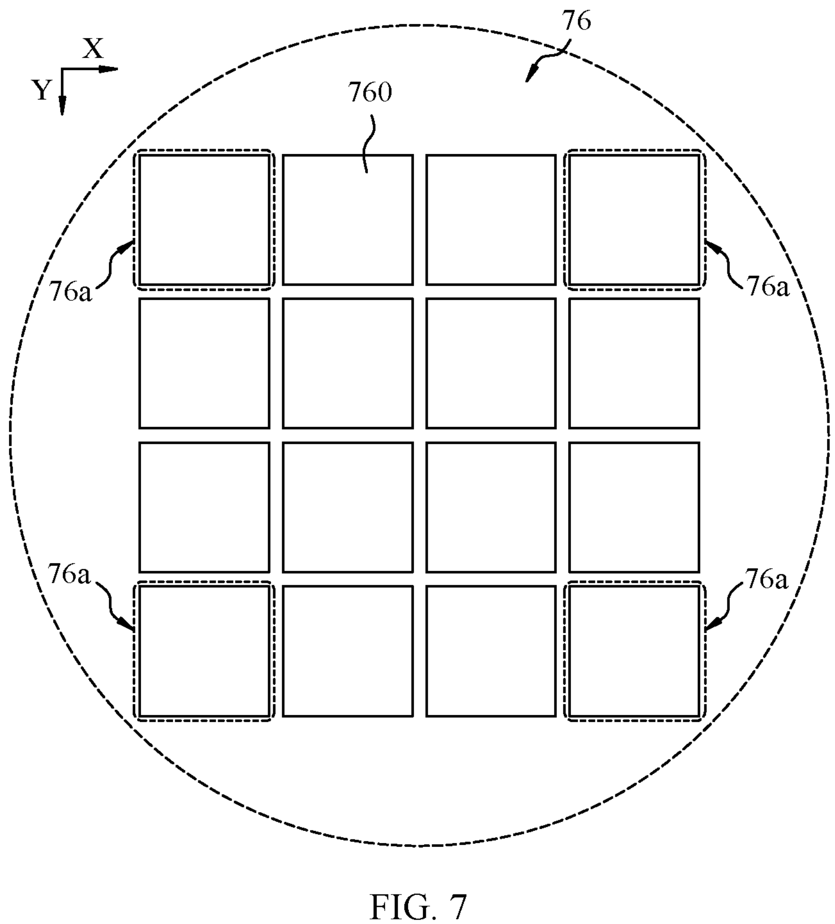
FIG. 7 is a schematic diagram of a top-view structure of a sensor array in a related technology.

In the related technology, FIG. 6 schematically shows a state in which one light channel 71 in a multispectral sensor 70 receives light. FIG. 7 schematically shows a top-view structure of a sensor array 76. Referring to FIG. 6 and FIG. 7, a plurality of photoelectric sensors 760 in the sensor array 76 are arranged in a rectangular alignment of rows and columns. In other words, a quantity of photoelectric sensors 760 arranged in each row is the same, so that the sensor array 76 has four corner regions 76*a*. A size of each photoelectric sensor 760 is the same. Light at different angles passes through an optical lens 74 and a filter part 75 and then reaches the photoelectric sensors 760 at different positions. Light illuminance received by each photoelectric sensor 760 is different. It should be noted that illuminance refers to intensity of light, namely, a luminous flux of light received per unit area. Among the plurality of photoelectric sensors 760, the photoelectric sensor 760 that is closer to an optical axis 71*a* receives higher illuminance, and the photoelectric sensor 760 that is farther away from the optical axis 71*a* receives lower illuminance. Therefore, the photoelectric sensor 760 that is separately arranged in a corner region 76*a* of the sensor array 76 receives low illuminance, which may easily lead to a decrease in signal-to-noise ratio and sensitivity, thereby affecting overall spectral detection performance of the multispectral sensor 70. The greater the field of view of the multispectral sensor 70, the lower the illuminance received by the photoelectric sensor 760 located in the corner region 76*a*. The field of view refers to a maximum range that may be observed, usually expressed in an angle. The greater the field of view of the multispectral sensor 70, the greater the observation range. When the multispectral sensor 70 is in a large field of view scene, light incident on the multispectral sensor 70 has a specific tilt. In addition, the farther away from the optical axis 71*a* (the closer to an edge of the maximum field of view), the less light enters the light entrance part 72. Therefore, the farther away from the optical axis 71*a*, the lower the illuminance of the light in the corner region 76*a*. Therefore, the greater the field of view, the lower the illuminance received by the photoelectric sensor 760 in the corner region 76*a* away from the optical axis 71*a*, and the worse the spectral detection performance.

In the multispectral sensor 70 provided in embodiments of this application, the sensor array 76 may improve a case that a signal-to-noise ratio and sensitivity of the photoelectric sensor are reduced due to low illuminance of the light received by the photoelectric sensor in the corner region 76*a*, which is conducive to ensuring that the multispectral sensor 70 has good detection sensitivity, and implements spectral detection with better comprehensive effects.

An implementation of the multispectral sensor 70 provided in embodiments of this application is described below.

Figure 8:
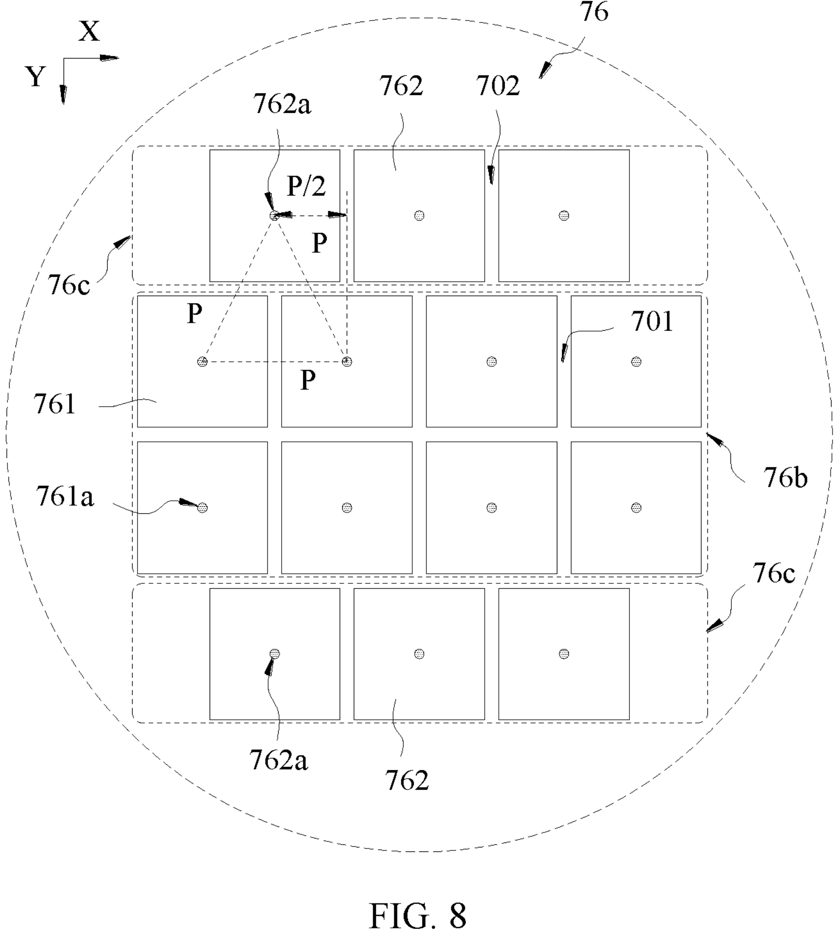
FIG. 8 is a schematic diagram of a top-view structure of a sensor array according to an embodiment of this application.

FIG. 8 schematically shows a top-view structure of a sensor array 76 according to an embodiment. Referring to FIG. 5 and FIG. 8, the multispectral sensor 70 in embodiments of this application includes at least one or two or more light channels 71. Each light channel 71 includes a light entrance part 72, an optical lens 74, a filter part 75, and a sensor array 76. The light entrance part 72, the optical lens 74, the filter part 75, and the sensor array 76 are arranged in an array in an axial direction Z of the light entrance part 72. The light channel 71 has an optical axis 71*a*. The optical axis 71*a* of the light channel 71 may coincide with an axis of the light entrance part 72. The light entrance part 72 is configured to allow external light to enter the light channel 71. For example, each light channel 71 may include one light entrance part 72. The optical lens 74 is configured to change a transmission path of light to be incident on the filter part 75. The filter part 75 is configured to allow light in a specific wavelength range to pass through and reach the sensor array 76. The sensor array 76 receives light in a specific wavelength range and then detects and collects corresponding spectral information.

In the multispectral sensor 70 in embodiments of this application, along the axial direction Z of the light entrance part 72, orthographic projection of the sensor array 76 is located in orthographic projection of the optical lens 74. A circular dotted line on a periphery of the sensor array 76 in FIG. 8 is used for illustrating an outer contour of orthographic projection of the optical lens 74. For example, a bottom surface of the optical lens 74 may be a flat surface, and a top surface may be a curved surface. The outer contour of the orthographic projection of the optical lens 74 may be in a shape of a circle. The sensor array 76 includes at least three rows of photoelectric sensors. For example, at least three rows of photoelectric sensors may be arranged in an array. The at least three rows of photoelectric sensors are divided into a middle sensor group 76*b* and an edge sensor group 76*c*. The middle sensor group 76*b* is located between the two edge sensor groups 76*c* in a column direction Y of the sensor array 76. The middle sensor group 76*b* includes a first photoelectric sensor 761. The edge sensor group 76*c* includes a second photoelectric sensor 762.

In a row direction X of the sensor array 76, a row of first photoelectric sensors 761 includes N first photoelectric sensors 761 and N−1 first gaps 701, where N is an integer greater than or equal to two. For the middle sensor group 76*b*, the first gap 701 is formed between two adjacent first photoelectric sensors 761 in each row, thereby helping to reduce possibility of light crosstalk between the two adjacent first photoelectric sensors 761. It should be noted that the row direction X and the column direction Y may be perpendicular to each other. A quantity of second photoelectric sensors 762 in a row adjacent to the row of first photoelectric sensors 761 is N−1, so that a quantity of second photoelectric sensors 762 in a row is equal to a quantity of first gaps 701 in a row: The second photoelectric sensor 762 is arranged corresponding to the first gap 701.

It should be noted that the second photoelectric sensor 762 is arranged corresponding to the first gap 701, which may mean that the second photoelectric sensor 762 and the first gap 701 are arranged in a distributed manner in the column direction Y. A second gap 702 is formed between two adjacent second photoelectric sensors 762 in the row direction X. The second photoelectric sensor 762 is arranged corresponding to the first gap 701, which may also mean that the first gap 701 and the second gap 702 are not on a same straight line in the column direction Y, so that the first gap 701 may be opposite to one side of the second photoelectric sensor 762. For example, the first gap 701 may be opposite to a middle part of one side of the second photoelectric sensor 762.

In the multispectral sensor 70 in embodiments of this application, external light may enter the multispectral sensor 70 through the light entrance part 72, and then illuminate the filter part 75 through the optical lens 74. Then, light at different angles to the optical axis 71*a* passes through the filter part 75 and then respectively reaches the first photoelectric sensor 761 and the second photoelectric sensors 762 that are at different positions in the sensor array 76. External light cannot enter the multispectral sensor 70 from a region other than the light entrance part 72, thereby reducing possibility that stray light is received by the first photoelectric sensor 761 and the second photoelectric sensor 762 and affects detection accuracy. In the sensor array 76, the first photoelectric sensor 761 and the second photoelectric sensor 762 that are at different positions are configured to receive light from different regions in a target scene. In other words, each first photoelectric sensor 761 and each second photoelectric sensor 762 are configured to receive light in a predetermined angle range, rather than receive light in all angles, so that detection on different regions of the target scene may be implemented, to implement accurate color perception and spectral analysis on the target scene, especially a scene in which color temperatures of different regions of the target scene are significantly different. It should be noted that the target scene may be, but is not limited to, a person, an object, scenery, or a light source that may emit light. For example, in the sensor array 76, the first photoelectric sensor 761 and the second photoelectric sensor 762 that are farther away from the optical axis 71*a* are configured to receive light closer to an edge region in the target scene. The first photoelectric sensor 761 that is closer to the optical axis 71*a* is configured to receive light that is farther away from the edge region in the target scene.

For example, the light entrance part 72 may be a circular hole. For example, the light entrance part 72 may be formed by drilling holes on a substrate 73 made of an opaque material. Alternatively, an opaque region and a transparent region are arranged on the substrate 73. The transparent region forms the light entrance part 72. The transparent region is a region that allows light of most or all wavelengths to pass through.

A central axis of the optical lens 74 coincides with an axis of the light entrance part 72. The optical lens 74 has a collimating function, so that light emitted from the optical lens 74 is closer to the optical axis 71*a* of the light channel 71 than light incident on the optical lens 74. For example, the optical lens 74 may be a wafer level optic (WLO). The wafer level optic is a micro-nano optical element made by using a semiconductor process to produce a micro-nano structure on a substrate wafer. For example, referring to FIG. 4, the optical lens 74 may include two layers of wafer level optics. Alternatively, the optical lens 74 may also include three or more layers of wafer level optics. A quantity of wafer level optics is not specifically limited herein.

Figure 9:
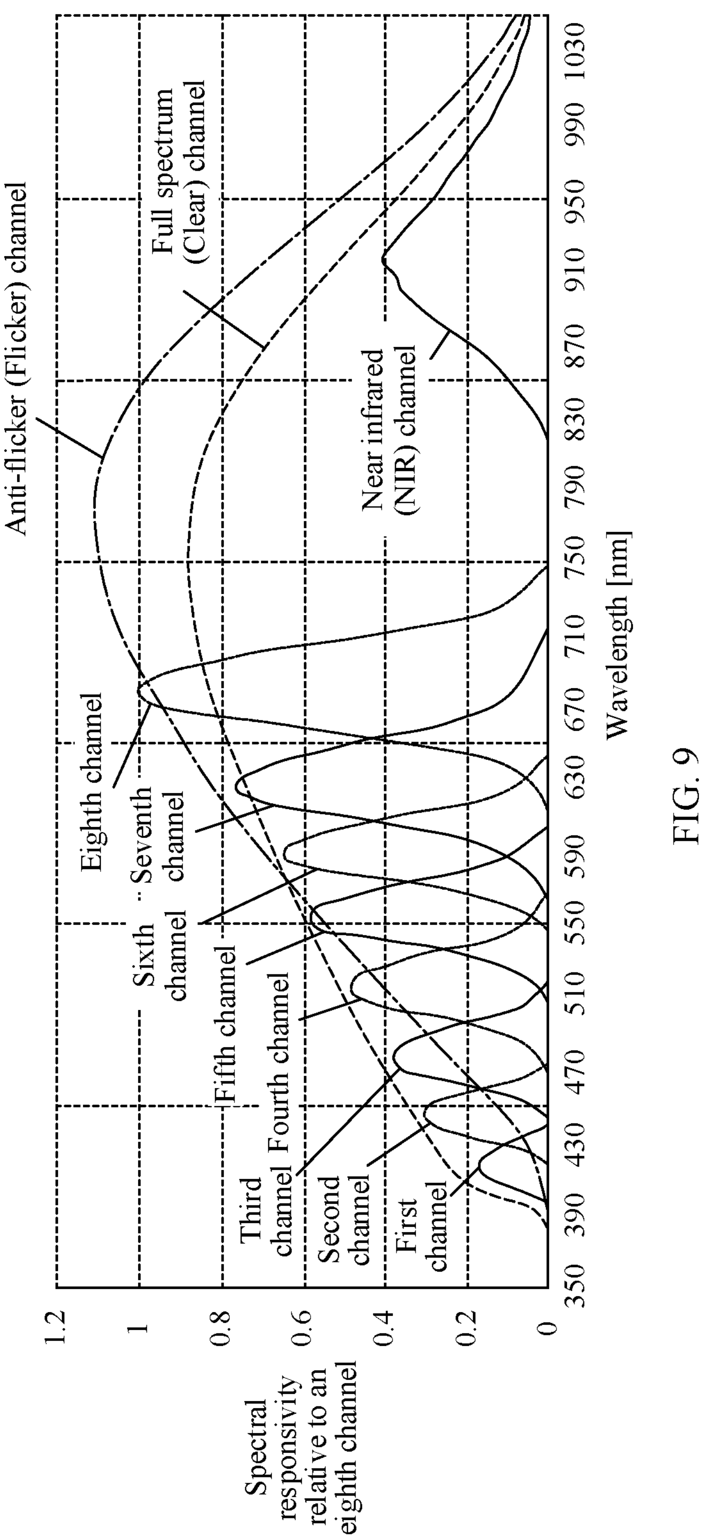
FIG. 9 is a schematic diagram of spectral responsivity of different light channels according to an embodiment of this application.

The filter part 75 is configured to allow light in a specific wavelength range to pass through and reach the sensor array 76. For example, referring to FIG. 9, when the light channel 71 is used as a different sensing channel, the filter part 75 may allow the light in a corresponding wavelength range in the spectrum to pass through. In FIG. 9, a first channel to an eighth channel, a full spectrum (Clear) channel, a near infrared (NIR) channel, and an anti-flicker (Flicker) channel are different light channels 71 respectively, and each light channel 71 corresponds to light in a specific wavelength range. A wavelength range detected by each light channel 71 is not limited to the wavelength range shown in FIG. 9, and may also be flexibly adjusted based on an actual product requirement. FIG. 9 schematically shows a predetermined quantity of light channels 71, but is not used for limiting the quantity of light channels 71 in the multispectral sensor 70. Any quantity of light channels 71 may be set based on an actual product requirement.

It may be understood that the light channel 71 may be used as a sensing channel of visible light, for example, the first channel to the eighth channel are sensing channels of visible light. The light channel 71 may also be used as the sensing channel of invisible light. For example, the invisible light may include but is not limited to ultraviolet, near-infrared (NIR), short-wave infrared (SWIR), infrared (IR), or long-wave infrared (LWIR).

For example, the filter part 75 may be a filter.

In embodiments of this application, an example in which in the column direction Y, the edge sensor group 76*c* is located on one side of the middle sensor group 76*b* is used for description. However, a specific arrangement manner of the middle sensor group 76*b* and the edge sensor group 76*c* is not limited. For example, in some examples, the edge sensor group 76*c* is located on one side of the middle sensor group 76*b* in the row direction X.

In some possible implementations, the multispectral sensor 70 includes a light-proof housing 77. The optical lens 74, the filter, and the sensor array 76 are arranged in the housing 77.

In the multispectral sensor 70 in embodiments of this application, the sensor array 76 includes a middle sensor group 76*b* and an edge sensor group 76*c*. The edge sensor group 76*c* is arranged on one side of the middle sensor group 76*b*. The first photoelectric sensor 761 and the second photoelectric sensor 762 in the sensor array 76 are arranged in a mutually misaligned manner. The first photoelectric sensor 761 and the second photoelectric sensor 762 are located in different regions. A quantity of second photoelectric sensors 762 in a row is less than a quantity of first photoelectric sensors 761 in each row, so that one complete second photoelectric sensor 762 is not separately arranged in a corner region 76*a* of the sensor array 76, which in turn may cause the sensor array 76 to better retain a field of view and a quantity of regions in which the sensor array receives light, and discard the independently arranged photoelectric sensor in the corner region 76*a* with poor detection performance.

Therefore, the multispectral sensor 70 in embodiments of this application is conducive to improving a case that a signal-to-noise ratio and sensitivity of the photoelectric sensor are reduced due to low illuminance of the light received by the photoelectric sensor arranged separately in the corner region 76*a*, which is conducive to ensuring that the multispectral sensor 70 has good detection sensitivity and high light energy utilization, and implements spectral detection with better comprehensive effects.

In some possible implementations, the middle sensor group 76*b* includes one or two or more rows of first photoelectric sensors 761. Each of the two edge sensor groups 76*c* includes one or two or more rows of second photoelectric sensors 762. For example, a quantity of first photoelectric sensors 761 in each row of the middle sensor group 76*b* is equal. a quantity of second photoelectric sensors 762 in each row in the edge sensor group 76*c* is less than a quantity of first photoelectric sensors 761 in each row in the middle sensor group 76*b*.

In some possible implementations, referring to FIG. 8, the sensor array 76 may include four rows of photoelectric sensors. The middle sensor group 76*b* includes two rows of first photoelectric sensors 761. For example, a quantity of first photoelectric sensors 761 in each row may be, but is not limited to, four, to be specific, a value of N is four. Each of the two edge sensor groups 76*c* includes one row of second photoelectric sensors 762. For example, the two edge sensor groups 76*c* include the same quantity of second photoelectric sensors 762. The quantity of second photoelectric sensors 762 in a row is one less than the quantity of first photoelectric sensors 761 in a row. For example, the quantity of second photoelectric sensors 762 in a row may be, but is not limited to, three.

In some possible implementations, the first photoelectric sensor 761 and the second photoelectric sensor 762 are configured to convert an optical signal into an electrical signal (for example, a digital electrical signal or an analog electrical signal). The first photoelectric sensor 761 and the second photoelectric sensor 762 may be photodiodes (photodiode). The photodiode may be a semiconductor device including one PN junction and has unidirectional conduction features.

In some possible implementations, referring to FIG. 8, each first photoelectric sensor 761 in the middle sensor group 76*b* has a first center 761*a*. The first center 761*a* is an illumination center in which light enters a photosensitive plane of the first photoelectric sensor 761 after passing through the optical lens 74 and the filter part 75. The first center 761*a* shown in FIG. 8 does not represent an actual physical structure. The middle sensor group 76*b* includes two or more rows of first photoelectric sensors 761. The first centers 761*a* of each column of first photoelectric sensors 761 are located on a same straight line, so that in a column direction Y, each first photoelectric sensor 761 is arranged regularly. In some examples, the first photoelectric sensor 761 may be in a shape of a rectangle, such as a rectangle or a square. The first photoelectric sensor 761 may also be in a shape of a circle, an ellipse, or a regular polygon with more than four sides. When the first photoelectric sensor 761 is in a regular shape, the first center 761*a* may be a geometric center of the first photoelectric sensor 761.

In some possible implementations, a shape and a size of the first photoelectric sensor 761 are the same as a shape and a size of the second photoelectric sensor 762 respectively, so that a photosensitive area of the first photoelectric sensor 761 and a photosensitive area of the second photoelectric sensor 762 are the same, and an angle range in which the first photoelectric sensor 761 receives light and an angle range in which the second photoelectric sensor 762 receives light are the same, which is conducive to improving accuracy of regional detection of a target scene by the sensor array 76. The photosensitive area is a surface facing the optical lens 74 that may be used for receiving light. In some examples, the first photoelectric sensor 761 and the second photoelectric sensor 762 may be in a shape of a rectangle, such as a rectangle or a square. The first photoelectric sensor 761 and the second photoelectric sensor 762 may also be in a shape of a circle, an ellipse, or a regular polygon with a quantity of sides greater than 4. Specific shapes and sizes of the first photoelectric sensor 761 and the second photoelectric sensor 762 are not limited herein.

In some examples, referring to FIG. 8, each second photoelectric sensor 762 in the edge sensor group 76*c* has a second center 762*a*. The second center 762*a* is an illumination center in which light enters a photosensitive plane of the second photoelectric sensor 762 after passing through the optical lens 74 and the filter part 75. The second center 762*a* shown in FIG. 8 does not represent an actual physical structure. For example, When the second photoelectric sensor 762 is in a regular shape, the second center 762*a* may be a geometric center of the second photoelectric sensor 762.

In some examples, in the sensor array 76, lines connecting a second center 762*a* of one second photoelectric sensor 762 and first centers 761*a* of two adjacent first photoelectric sensors 761 form an equilateral triangle. In the edge sensor group 76*c*, a vertical distance between second centers 762*a* of two adjacent second photoelectric sensors 762 is P in the row direction X. In the middle sensor group 76*b*, a vertical distance between first centers 761*a* of two adjacent first photoelectric sensors 761 in each row is P in the row direction X. A vertical distance between the second center 762*a* of the second photoelectric sensor 762 and the first center 761*a* of the first photoelectric sensor 761 is P/2 in the row direction X. Therefore, in the edge sensor group 76*c*, the second photoelectric sensor 762 is not separately arranged in a partial region corresponding to the first photoelectric sensor 761 at the outermost side, so that the sensor array 76 does not receive light in the region, which is conducive to reducing possibility that the signal-to-noise ratio and the sensitivity are decreased due to the low illuminance received by the second photoelectric sensor 762 arranged separately in the region, affecting spectral detection performance. In addition, a quantity of second photoelectric sensors 762 is one less than a quantity of first photoelectric sensors 761 in each adjacent row: In addition, in the column direction Y, a part of second photoelectric sensors 762 located at the outermost side are arranged corresponding to a part of first photoelectric sensors 761 located at the outermost side, so that the sensor array 76 may retain the field of view and the quantity of regions in which the sensor array 76 receives light to a greater extent, which is conducive to ensuring that the multispectral sensor 70 has good detection sensitivity and high light energy utilization, and implements spectral detection with better comprehensive effects.

In some examples, the first photoelectric sensor 761 and the second photoelectric sensor 762 are in a regular shape. For example, a regular polygon, a circle, or an ellipse. In the edge sensor group 76*c*, the second photoelectric sensor 762 is not separately arranged in a partial region corresponding to the first photoelectric sensor 761 at the outermost side. In addition, a quantity of second photoelectric sensors 762 is one less than a quantity of first photoelectric sensors 761 in each adjacent row: In addition, in the column direction Y, a part of second photoelectric sensors 762 located at the outermost side are arranged corresponding to a partial region of the first photoelectric sensor 761 located at the outermost side.

Figure 10:
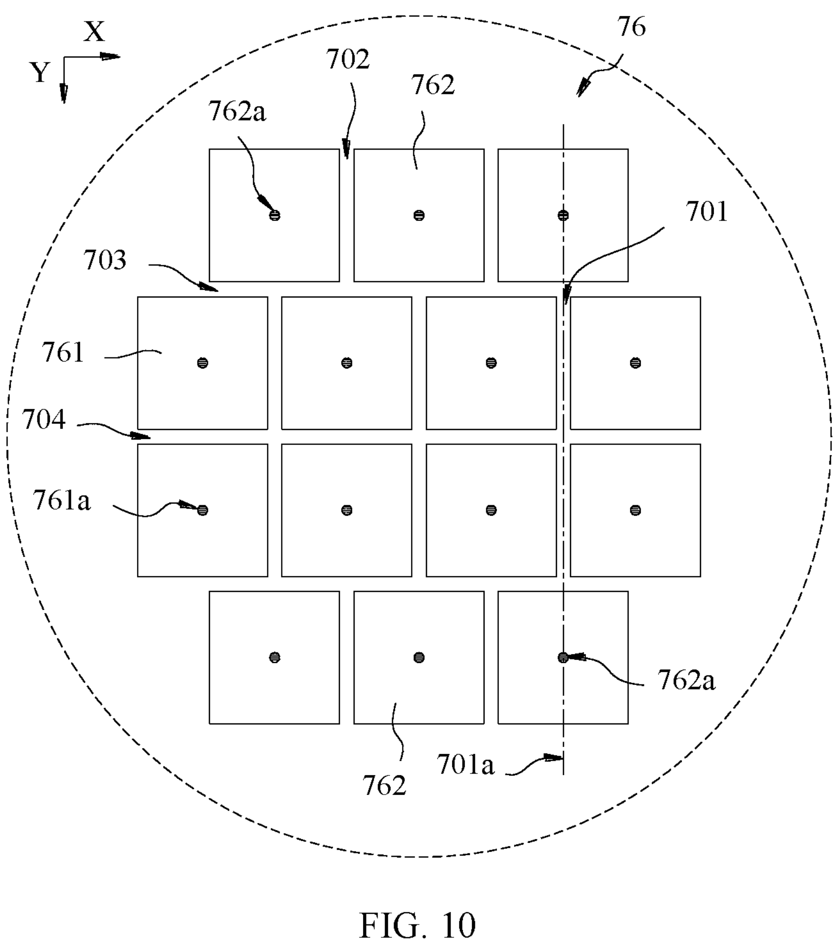
FIG. 10 is a schematic diagram of a top-view structure of a sensor array according to another embodiment of this application.

In some possible implementations, FIG. 10 schematically shows a top-view structure of a sensor array 76 according to an embodiment. Referring to FIG. 10, there is a second gap 702 between two adjacent second photoelectric sensors 762 in the row direction X, thereby helping to reduce possibility of light crosstalk between the two adjacent second photoelectric sensors 762 and ensuring that the sensor array 76 has good detection accuracy. The second photoelectric sensor 762 is arranged corresponding to the first gap 701, so that the first gap 701 and the second gap 702 are not on a same straight line in the column direction Y. For example, the second center 762*a* of the second photoelectric sensor 762 is located on a center line 701*a* of the first gap 701. The center line 701*a* of the first gap 701 extends in the column direction Y. The center line 701*a* of the first gap 701 is an axis of symmetry of the first gap 701. For example, a shape of the first gap 701 is the same as a shape of the second gap 702. For example, when both the first photoelectric sensor 761 and the second photoelectric sensor 762 are in a shape of a square of the same size, both the first gap 701 and the second gap 702 are in a shape of a strip, and a width of the first gap 701 and a width of the second gap 702 in the row direction X are equal.

In some possible implementations, there is a third gap 703 between the first photoelectric sensor 761 and the second photoelectric sensor 762 in the column direction Y, thereby helping to reduce possibility of light crosstalk between the first photoelectric sensor 761 and the second photoelectric sensor 762 and ensuring that the sensor array 76 has good detection accuracy. For example, a shape of the first gap 701 is the same as a shape of the third gap 703. For example, when both the first photoelectric sensor 761 and the second photoelectric sensor 762 are in a shape of a square of the same size, both the first gap 701 and the third gap 703 are in a shape of a strip, and a width of the first gap 701 and a width of the third gap 703 are equal.

In some possible implementations, the middle sensor group 76*b* includes two or more rows of first photoelectric sensors 761. There is a fourth gap 704 between two adjacent first photoelectric sensors 761 in the column direction Y, thereby helping to reduce possibility of light crosstalk between the first photoelectric sensor 761 and the second photoelectric sensor 762 and ensuring that the sensor array 76 has good detection accuracy. For example, a shape of the first gap 701 is the same as a shape of the fourth gap 704. For example, when the first photoelectric sensor 761 is in a shape of a square, both the first gap 701 and the fourth gap 704 are in a shape of a strip, and a width of the first gap 701 is equal to a width of the fourth gap 704.

In some possible implementations, in the middle sensor group 76*b*, a quantity of first photoelectric sensors 761 arranged in each row is equal. The first centers 761*a* in each row of first photoelectric sensors 761 are located on a same straight line in the row direction X, so that each first photoelectric sensor 761 is arranged in a regular and orderly manner in the row direction X.

In some examples, the first centers 761*a* of each column of first photoelectric sensors 761 are located on a same straight line, so that in a column direction Y, each first photoelectric sensor 761 is arranged in a regular and orderly manner, so that each first photoelectric sensor 761 in the middle sensor group 76*b* is arranged in a matrix manner. Further, first photoelectric sensors 761 are evenly spaced in the row direction X and the column direction Y. A vertical distance between first centers 761*a* of two adjacent first photoelectric sensors 761 in each row is P in the row direction X. In the column direction Y, a vertical distance between the first centers 761*a* of the two adjacent first photoelectric sensors 761 in each row is P. For example, a shape of the first photoelectric sensor 761 may be, but is not limited to, a square or a circle, so that a shape and a width of the first gap 701 are the same as a shape and a width of the fourth gap 704 respectively.

In some possible implementations, in the edge sensor group 76*c*, second centers 762*a* of the second photoelectric sensors 762 are located on a same straight line in the row direction X, so that each second photoelectric sensor 762 is arranged in a regular and orderly manner. For example, a vertical distance between second centers 762*a* of two adjacent second photoelectric sensors 762 is P in the row direction X. A shape of the second photoelectric sensor 762 may be, but is not limited to, a square or a circle.

Figure 11:
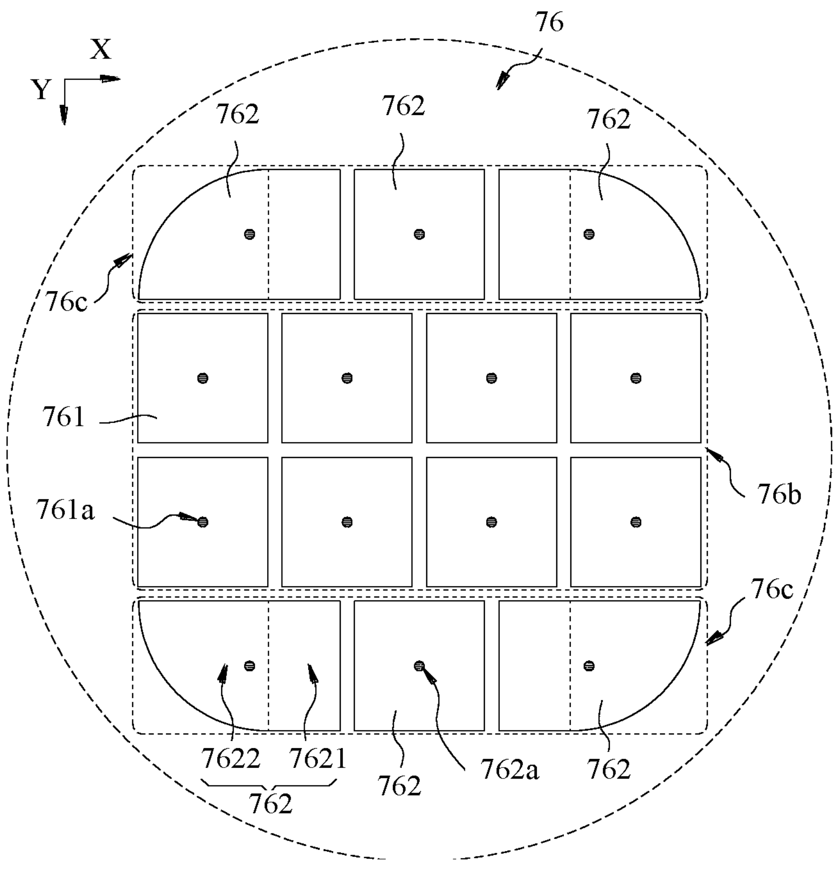
FIG. 11 is a schematic diagram of a top-view structure of a sensor array according to yet another embodiment of this application.

In some possible implementations, FIG. 11 schematically shows a top-view structure of a sensor array 76 according to an embodiment. Referring to FIG. 11, a quantity of second photoelectric sensors 762 in a row may be three, to be specific, a value of N is four. It may be understood that the quantity of second photoelectric sensors 762 in a row may also be greater than four, to be specific, the value of N is an integer greater than or equal to five. a photosensitive area of at least one of the two second photoelectric sensors 762 located at the outermost side in the second photoelectric sensors 762 in a row is greater than a photosensitive area of the first photoelectric sensor 761 in the row direction. At least one of the two second photoelectric sensors 762 located at the outermost side may receive light in a greater angle range by increasing a photosensitive area. Therefore, at least one of the two second photoelectric sensors 762 located at the outermost side may compensate for the low illuminance in the corner region 76*a* by increasing the photosensitive area, so that the sensor array 76 may retain the field of view and the quantity of regions in which the sensor array 76 receives light to a greater extent without the need to separately arrange one second photoelectric sensor 762 in the corner region 76*a*, which is conducive to ensuring that the multispectral sensor 70 has good detection sensitivity and high light energy utilization, and implements spectral detection with better comprehensive effects. In addition, because a photosensitive area of at least one of the two second photoelectric sensors 762 at the outermost side is increased, an angle range in which light is received may be further increased, thereby increasing a detection range.

For example, in the edge sensor group 76*c*, a photosensitive area of the two second photoelectric sensors 762 located at the outermost side is greater than a photosensitive area of the first photoelectric sensor 761 in the row direction X. For example, a photosensitive area of each of the two second photoelectric sensors 762 located at the outermost side may be equal.

In some examples, the first photoelectric sensor 761 may be in a shape of a square. The second photoelectric sensor 762 located at the outermost side includes a rectangular region 7621 and a fan-shaped region 7622. The fan-shaped region 7622 of the second photoelectric sensor 762 is located at an outer side of the rectangular region 7621. An arc-shaped edge of the fan-shaped region 7622 of the second photoelectric sensor 762 may be used as a boundary at a corner of the sensor array 76. For example, the rectangular region 7621 of the second photoelectric sensor 762 is in a shape of a rectangle. A photosensitive area of the rectangular region 7621 of the second photoelectric sensor 762 may be less than a photosensitive area of the first photoelectric sensor 761.

In some examples, in the edge sensor group 76*c*, a region between the two second photoelectric sensors 762 located at the outermost side is a middle region. In the edge sensor group 76*c*, a photosensitive area of at least one of the two second photoelectric sensors 762 located at the outermost side is greater than a photosensitive area of the second photoelectric sensor 762 located in a middle region in the row direction X. It should be noted that the second photoelectric sensors 762 in the middle region refer to all second photoelectric sensors 762 except the two second photoelectric sensors 762 at the outermost side. For example, a photosensitive area of the second photoelectric sensor 762 in the middle region may be equal to a photosensitive area of the first photoelectric sensor 761. For example, a shape and a size of the second photoelectric sensor 762 located in the middle region are respectively the same as a shape and a size of the first photoelectric sensor 761. For example, both the first photoelectric sensor 761 and the second photoelectric sensor 762 are in a shape of a square or a circle.

Figure 12:
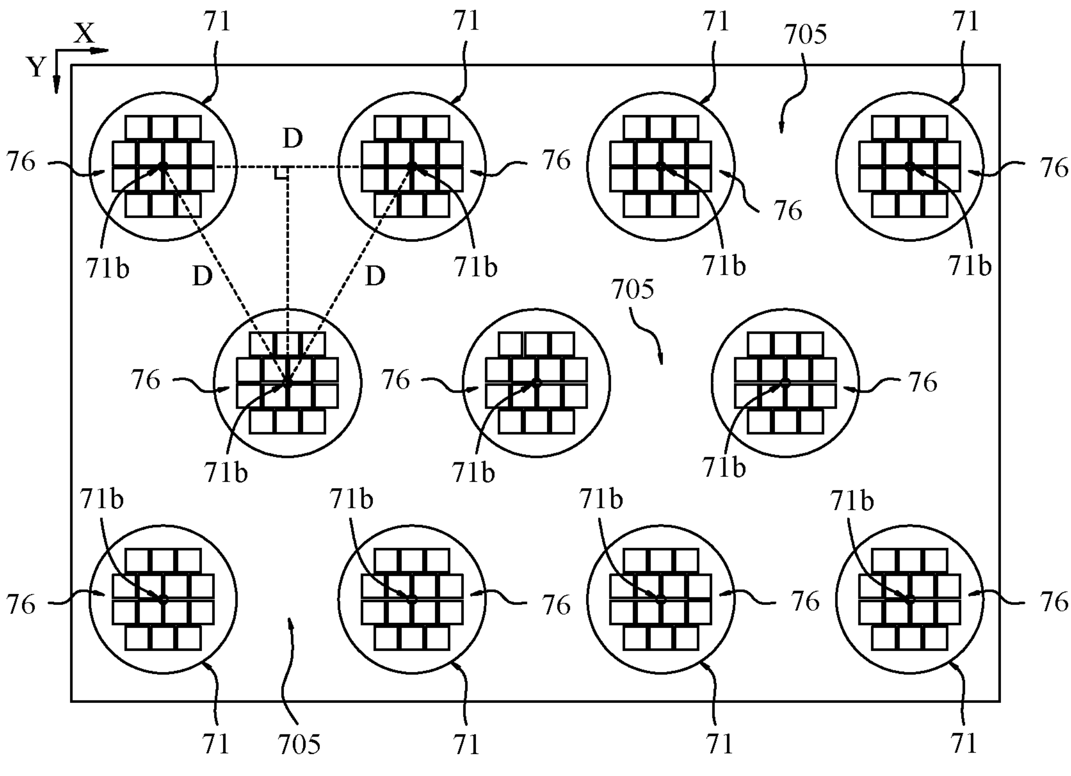
FIG. 12 is a schematic diagram of a top-view structure of a multispectral sensor including a plurality of light channels according to an embodiment of this application.

In some possible implementations, FIG. 12 schematically shows a top-view structure of a multispectral sensor 70 including a plurality of light channels 71 according to an embodiment. Referring to FIG. 12, the multispectral sensor 70 includes two or more rows of light channels 71. In embodiments of this application, two or more rows of light channels 71 may simultaneously obtain a plurality of optical signals in different wavelength ranges. Then a multispectral image is synthesized, thereby implementing real-time collection of different light channels 71 in multispectral image information, which is conducive to improving accuracy of the multispectral image and operating efficiency of signal collection. For example, each light channel 71 may include one light entrance part 72, one filter part 75, and one sensor array 76.

In some possible implementations, at least one of the two or more rows of light channels 71 is a color channel of visible light. Two or more rows of light channels 71 include the color channel of visible light, so that the visible light may be received and detected. In some examples, two or more rows of light channels 71 may all be color channels of visible light. Alternatively, two or more rows of light channels 71 include color channels of visible light and sensing channels of invisible light. By selecting a corresponding filter part 75, the light channel 71 may receive a channel in a corresponding wavelength range.

For example, the multispectral sensor 70 includes the same light channel 71, for example, includes two or more light channels 71 with the same filter part 75, so that two or more light channels 71 with the same filter part 75 may receive light in the same wavelength range.

For example, one of two or more rows of light channels 71 may be used as an anti-flicker (Flicker) channel. The anti-flicker (Flicker) channel may sample ambient light, to detect a frequency of the light source and adjust exposure time based on frequency information of the light source, thereby more accurately eliminating a stroboscopic phenomenon in the image, to obtain an image of higher definition.

For example, the multispectral sensor 70 may include eight light channels 71 or ten light channels 71.

In some possible implementations, the light channel 71 has a channel center 71*b*. The channel center 71*b* is located on an axis of the light entrance part 72. The channel center 71*b* shown in FIG. 12 does not represent an actual physical structure. A quantity of light channels 71 in each row is two or more. In the two adjacent rows of light channels 71, in the column direction Y, light channels 71 in one row are arranged with light channels 71 in the other row in a mutually misaligned manner. In the two adjacent rows of light channels 71, there is a connecting line between one channel center 71*b* in one row and one adjacent channel center 71*b* in the other row, and an angle between the connecting line and the column direction Y is not zero. There is a fifth gap 705 between two adjacent light channels 71 in each row of light channels 71. In the two adjacent rows of light channels 71, one row of the light channels 71 are arranged corresponding to the fifth gap 705 in the other row of the light channels 71.

It should be noted that one row of the light channels 71 are arranged corresponding to the fifth gap 705 in the other row of the light channels 71, which may mean that the light channels 71 and the fifth gap 705 are distributed in the column direction Y. One row of light channels 71 is arranged corresponding to the fifth gap 705 in the other row of light channels 71, which may also mean that two adjacent fifth gaps 705 are not on a same straight line in the column direction Y, so that the fifth gap 705 may be opposite to an edge of the light channel 71.

Lines connecting channel centers 71*b* of two adjacent light channels 71 in one row and a channel center 71*b* of the corresponding light channel 71 in the other row form a triangle. Therefore, in the column direction Y, a length of a perpendicular line between channel centers 71*b* of the two adjacent light channels 71 in one row and the channel center 71*b* of one light channel 71 in the other row is less than a length of lines connecting any two of the three channel centers 71*b*. Therefore, a distance between two adjacent rows of light channels 71 is less in the column direction Y, so that in a case of ensuring that the multispectral sensor 70 has high detection performance, an overall area occupied by the sensor array 76 is reduced, thereby improving space utilization, and being conducive to miniaturization design of the multispectral sensor 70. In this way, the multispectral sensor 70 may be integrated into an electronic device 10 with an overall compact structure.

In some examples, the lines connecting the channel centers 71*b* of the two adjacent light channels 71 in the one row and the channel center 71*b* of the corresponding light channel 71 in the other row form an equilateral triangle, so that a distance D between any two of the three channel centers 71*b* is equal. Therefore, the distance between the three light channels 71 is equal, which is conducive to reducing possibility that the two adjacent light channels 71 are prone to crosstalk due to the less distance between the two adjacent light channels 71 in the three light channels 71, thereby ensuring detection accuracy and detection performance of the multispectral sensor 70.

In some possible implementations, in each row of light channels 71, the channel centers 71*b* of the light channels 71 are located on a same straight line, so that each light channel 71 is arranged in a regular and orderly manner, which is conducive to ensuring that an overall size of the multispectral sensor 70 is regular. For example, each light channel 71 is evenly spaced.

In some possible implementations, an orthographic projection area of each optical lens 74 is the same, and a shape and a size of each light entrance part 72 are the same, which is conducive to ensuring consistency of the field of view of each light channel 71 and ensures the detection accuracy of the multispectral sensor 70. For example, an outer contour of orthographic projection of each optical lens 74 is in a shape of a circle. The light entrance part 72 may be a circular hole or a tapered hole.

In the description of embodiments of this application, it should be noted that, unless otherwise explicitly stipulated and restricted, terms "installation", "joint connection", and "connection" should be understood broadly, which, for example, may be a fixed connection, or may be an indirect connection by using a medium, or may be an internal communication between two components, or may be an interactive relationship between two components. A person of ordinary skill in the art may understand the specific meanings of the foregoing terms in embodiments of this application according to specific situations.

In embodiments of this application, it is implied that an apparatus or element in question needs to have a particular orientation, or needs to be constructed and operated in a particular orientation, and therefore cannot be construed as a limitation on embodiments of this application. In the description of embodiments of this application, unless otherwise exactly and specifically ruled, "a plurality of" means two or more.

The terms such as "first", "second", "third", and "fourth" (if any) in the specification and claims of embodiments of this application and in the accompanying drawings are used for distinguishing between similar objects and not necessarily used for describing any particular order or sequence. It may be understood that the data used in such a way is interchangeable in proper circumstances, so that embodiments of this application described herein can be implemented in other sequences than the sequence illustrated or described herein. Moreover, the terms "include", "contain" and any other variants mean to cover the non-exclusive inclusion. For example, a process, method, system, product, or device that includes a list of steps or units is not necessarily limited to those steps or units, but may include other steps or units not expressly listed or inherent to such a process, method, product, or device.

"Plurality of" in this specification means two or more. The term "and/or" in this specification describes only an association relationship for describing associated objects and represents that three relationships may exist. For example, A and/or B may represent the following three cases: Only A exists, both A and B exist, and only B exists. In addition, the character "/" in this specification generally indicates an "or" relationship between the associated objects; and in formulas, the character "/" indicates a "division" relationship between the associated objects.

It may be understood that various numbers in embodiments of this application are merely used for differentiation for ease of description, and are not used to limit the scope of embodiments of this application.

It should be understood that in the embodiments of this application, an order of sequence numbers of the foregoing processes does not indicate an execution sequence, and execution sequences of the processes should be determined according to functions and internal logics thereof and should not impose any limitation on an implementation process of the embodiments of this application.

What is claimed is:

1. A multispectral sensor, comprising at least:

one or two or more light channels, wherein the light channel comprises a light entrance part, an optical lens, a filter part, and a sensor array, the light entrance part is configured to allow external light to enter the light channel, the optical lens is configured to change a transmission path of the light to be incident on the filter part, and the filter part is configured to allow light in a specific wavelength range to pass through and reach the sensor array;

orthographic projection of the sensor array is located in orthographic projection of the optical lens in an axial direction of the light entrance part, the sensor array comprises at least three rows of photoelectric sensors, the at least three rows of photoelectric sensors are divided into a middle sensor group and an edge sensor group, the middle sensor group is located between two edge sensor groups in a column direction of the sensor array, the middle sensor group comprises a first photoelectric sensor, and the edge sensor group comprises a second photoelectric sensor; and in a row direction of the sensor array, a row of first photoelectric sensors comprises N first photoelectric sensors and N−1 first gaps, and the first gap is formed between two adjacent first photoelectric sensors, a quantity of second photoelectric sensors in a row adjacent to the row of first photoelectric sensors is N−1, and the second photoelectric sensor is arranged corresponding to the first gap in the column direction; and wherein the first photoelectric sensor has a first center, the middle sensor group comprises two or more rows of first photoelectric sensors, and the first centers of each column of first photoelectric sensors are located on a same straight line.

2. The multispectral sensor according to claim 1, wherein a shape and a size of the first photoelectric sensor are respectively the same as a shape and a size of the second photoelectric sensor.

3. The multispectral sensor according to claim 2, wherein the second photoelectric sensor has a second center, and lines connecting one second center and two adjacent first centers form an equilateral triangle.

4. The multispectral sensor according to claim 1, wherein the quantity of second photoelectric sensors in the row is three or more, and in the row direction, a photosensitive area of at least one of two second photoelectric sensors located at an outermost side is greater than a photosensitive area of the first photoelectric sensor.

5. The multispectral sensor according to claim 4, wherein in the row direction, the photosensitive area of the at least one of the two second photoelectric sensors located at the outermost side is greater than a photosensitive area of the second photoelectric sensor located in a middle region.

6. The multispectral sensor according to claim 5, wherein a shape and a size of the second photoelectric sensor located in the middle region are respectively the same as a shape and a size of the first photoelectric sensor in the row direction.

7. The multispectral sensor according to claim 1, wherein there is a second gap between two adjacent second photoelectric sensors in the row direction; or there is a third gap between the first photoelectric sensor and the second photoelectric sensor in the column direction.

8. The multispectral sensor according to claim 7, wherein the first gap and the second gap are not on a same straight line in the column direction.

9. The multispectral sensor according to claim 1, wherein there is a fourth gap between two adjacent first photoelectric sensors in the column direction.

10. The multispectral sensor according to claim 1, wherein the first centers in each row of first photoelectric sensors are located on a same straight line in the row direction.

11. The multispectral sensor according to claim 1, wherein the second photoelectric sensor has a second center, and second centers in each row of second photoelectric sensors are located on a same straight line in the row direction.

12. The multispectral sensor according to claim 1, wherein in the middle sensor group, each first photoelectric sensor is in a shape of a rectangle.

13. The multispectral sensor according to according to claim 1, wherein the multispectral sensor comprises two or more rows of light channels, each light channel has a channel center, there is a fifth gap between two adjacent light channels in each row of light channels, and in two adjacent rows of light channels, one row of light channels are arranged corresponding to the fifth gap in the other row of light channels, and lines connecting the channel centers of the two adjacent light channels in the one row and the channel center of a corresponding light channel in the other row form a triangle.

14. The multispectral sensor according to claim 13, wherein the lines connecting the channel centers of the two adjacent light channels in the one row and the channel center of the corresponding light channel in the other row form an equilateral triangle.

15. The multispectral sensor according to claim 13, wherein in each row of light channels, the channel centers of the light channels are located on a same straight line in the row direction.

16. The multispectral sensor according to according to claim 13, wherein an orthographic projection area of each optical lens is the same, and a shape and a size of each light entrance part are the same.

17. The multispectral sensor according to claim 13, wherein at least one of the two or more rows of light channels is a color channel of visible light.

18. An electronic device, comprising at least one multispectral sensor, wherein the at least one multispectral sensor comprises:

one or more light channels, wherein each light channel of the one or more light channels comprises a light entrance part, an optical lens, a filter part, and a sensor array, the light entrance part is configured to allow external light to enter the respective light channel, the optical lens is configured to change a transmission path of the light to be incident on the filter part, and the filter part is configured to allow light in a specific wavelength range to pass through and reach the sensor array;

orthographic projection of the sensor array is located in orthographic projection of the optical lens in an axial direction of the light entrance part, the sensor array comprises at least three rows of photoelectric sensors, the at least three rows of photoelectric sensors are divided into a middle sensor group and an edge sensor group, the middle sensor group is located between two edge sensor groups in a column direction of the sensor array, the middle sensor group comprises a first photoelectric sensor, and the edge sensor group comprises a second photoelectric sensor; and in a row direction of the sensor array, a row of first photoelectric sensors comprises N first photoelectric sensors and N−1 first gaps, and the first gap is formed between two adjacent first photoelectric sensors, a quantity of second photoelectric sensors in a row adjacent to the row of first photoelectric sensors is N−1, and the second photoelectric sensor is arranged corresponding to the first gap in the column direction; and wherein the first photoelectric sensor has a first center, the middle sensor group comprises two or more rows of first photoelectric sensors, and the first centers of each column of first photoelectric sensors are located on a same straight line.

19. A multispectral sensor, comprising:

a plurality of light channels, wherein each light channel of the plurality of light channel comprises a light entrance part, an optical lens, a filter part, and a sensor array, the light entrance part is configured to allow external light to enter the respective light channel, the optical lens is configured to change a transmission path of the light to be incident on the filter part, and the filter part is configured to allow light in a specific wavelength range to pass through and reach the sensor array;

orthographic projection of the sensor array is located in orthographic projection of the optical lens in an axial direction of the light entrance part, the sensor array comprises at least three rows of photoelectric sensors, the at least three rows of photoelectric sensors are divided into a middle sensor group and an edge sensor group, the middle sensor group is located between two edge sensor groups in a column direction of the sensor array, the middle sensor group comprises a first photoelectric sensor, and the edge sensor group comprises a second photoelectric sensor; and in a row direction of the sensor array, a row of first photoelectric sensors comprises N first photoelectric sensors and N−1 first gaps, and the first gap is formed between two adjacent first photoelectric sensors, a quantity of second photoelectric sensors in a row adjacent to the row of first photoelectric sensors is N−1, and the second photoelectric sensor is arranged corresponding to the first gap in the column direction; and wherein the multispectral sensor comprises two or more rows of light channels, each light channel has a channel center, there is a fifth gap between two adjacent light channels in each row of light channels, and in the two adjacent rows of light channels, one row of light channels are arranged corresponding to the fifth gap in the other row of light channels, and lines connecting the channel centers of the two adjacent light channels in the one row and the channel center of a corresponding light channel in the other row form a triangle.

20. The multispectral sensor according to claim 19, wherein the quantity of second photoelectric sensors in the row is three or more, and in the row direction, a photosensitive area of at least one of two second photoelectric sensors located at an outermost side is greater than a photosensitive area of the first photoelectric sensor.

* * * * *